United States Patent [19]

McAuley

[11] Patent Number: 5,219,145
[45] Date of Patent: Jun. 15, 1993

[54] ADJUSTABLY DEFLECTABLE SPRING PLATE DEVICE

[75] Inventor: Richard S. McAuley, Costa Mesa, Calif.

[73] Assignee: Unisys Corporation, Blue Bell, Pa.

[21] Appl. No.: 759,010

[22] Filed: Sep. 12, 1991

[51] Int. Cl.⁵ .................................. F16M 13/00
[52] U.S. Cl. .................... 248/629; 267/158; 267/160; 267/181
[58] Field of Search ............. 248/629, 618, 575, 300, 248/626, 903; 211/40, 41; 312/9.52; 267/160, 158, 163, 181

[56] References Cited

U.S. PATENT DOCUMENTS

| | | | |
|---|---|---|---|
| 1,260,075 | 3/1918 | Shaw | 248/626 X |
| 1,261,396 | 4/1918 | Jackman | 248/626 X |
| 2,704,112 | 3/1955 | Rice | 248/626 X |
| 3,627,248 | 12/1971 | Nelson | 248/300 X |
| 4,932,353 | 11/1975 | Nelson | 248/300 X |
| 5,106,586 | 4/1992 | Muszak et al. | 267/158 X |
| 5,116,699 | 5/1992 | Miyajima | 267/160 X |

Primary Examiner—Ramon O. Ramirez
Attorney, Agent, or Firm—Alfred W. Kozak; Mark T. Starr

[57] ABSTRACT

An apparatus for minimizing bending distortion in base support planes of tray units holding weighted modules. A cut out flap in the base plane is set at an angle to form a deflection spring plate against the module weight. The angle is adjustable to operate for various weight modules, material composition of the tray unit and deflection plate parameters.

15 Claims, 5 Drawing Sheets

D1 = UPPER DEFLECTION
D2 = LOWER DEFLECTION

ADJUSTABLY DEFLECTABLE SPRING PLATE DEVICE

FIELD OF THE INVENTION

This invention relates to simple yet efficient support devices to control deflections and distortive appearance gaps in mounted flat plates holding weighted modules.

BACKGROUND OF THE INVENTION

Figure 5:
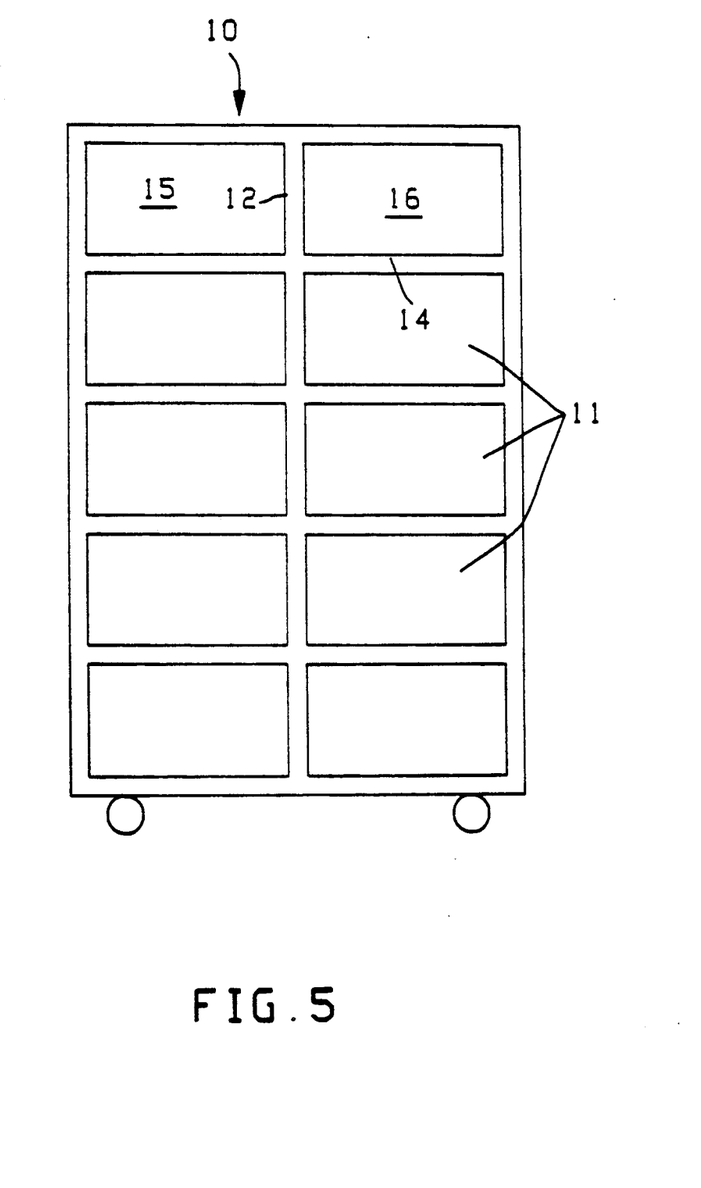
FIG. 5 is a standard type rack cabinet having open areas of recess into which can be placed electronic modules such as rack mounted disk modules.

As seen in FIG. 5 many manufacturers use a standard type cabinet which provides multiple numbers of recessed areas with trays which hold, for example, rack mountable cartridge tape units, and which can be placed into the recesses for positioning and support.

Figure 1A:
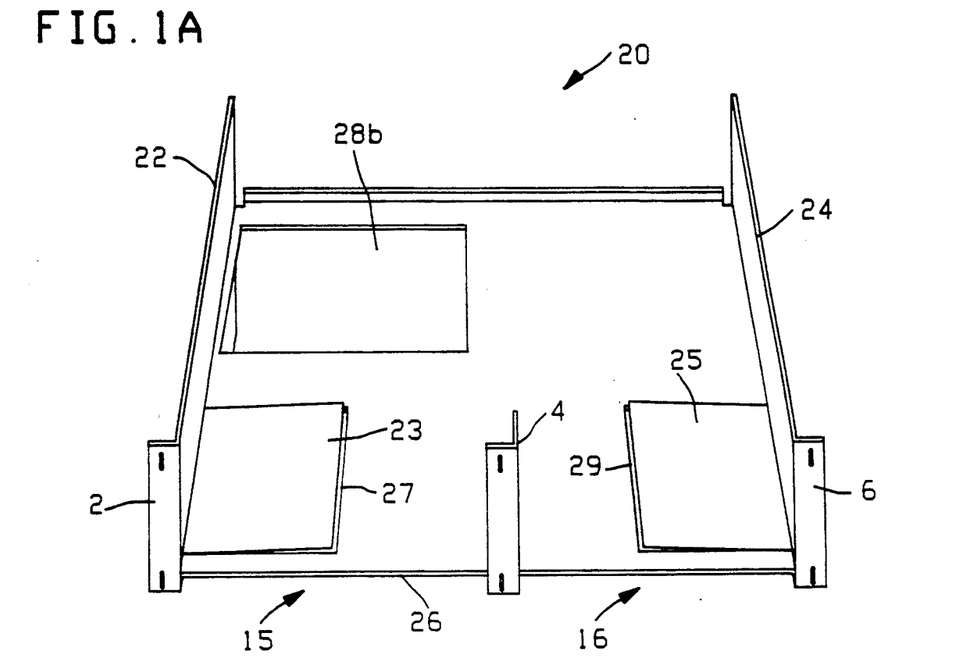
FIG. 1A shows a tray unit for holding electronic modules which can be inserted into the front recesses or slots of the tray unit inside a module cabinet.
Figure 2:
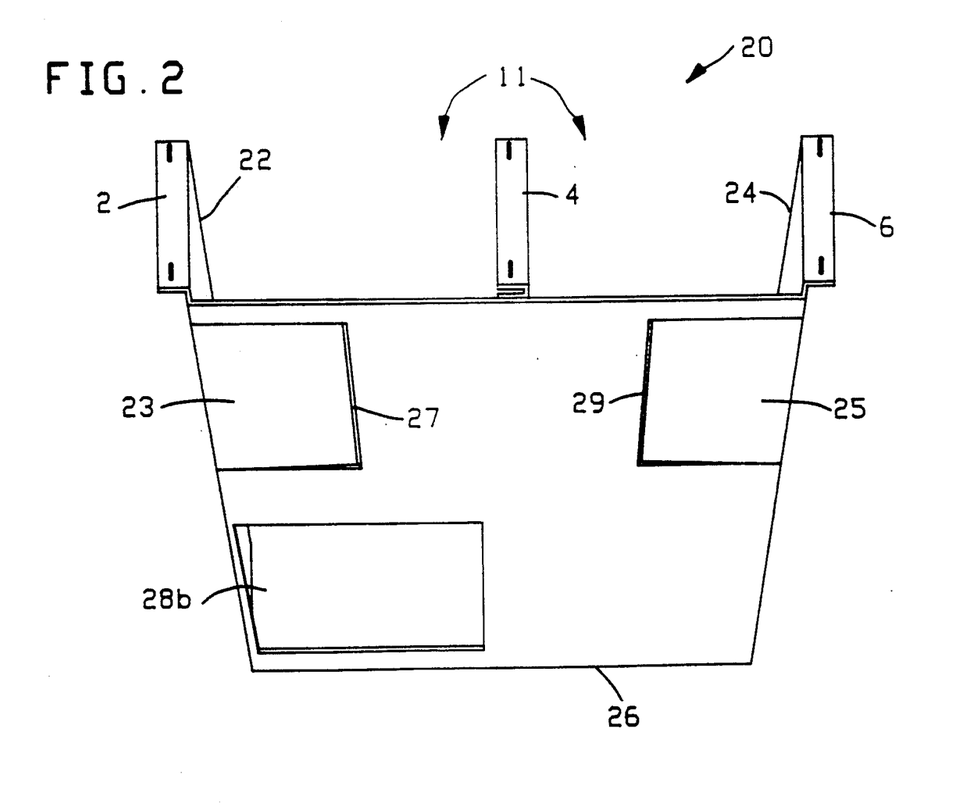
FIG. 2 is a view of the underside of the supporting flat plate tray unit showing the cut out portions which provide the spring plate members.

Generally, highly dense items such as rack mountable cartridge tape modules are supported by a tray unit such as tray 20 of FIGS. 1 and 2 which are located in the recessed areas 11 shown in FIG. 5.

FIG. 5 shows a typical cabinet unit 10 having slot or recessed areas 11 into which may be placed heavy duty electronic equipment such as a typical rack mountable cartridge tape module. Such a unit might, for example, be installed in the recessed area 16 of FIG. 5.

The problem arises in many cases where the tray, in its standard format, does not provide sufficient stiffness to support the weight and various configurations of the tape module which it was required to hold.

Typical bending distortion and deflection measurements performed on such a standard cabinet and tray units showed that the mounted cartridge tape module would deform the tray unit by an amount, for example, of 6/100 of an inch while the appearance requirements of the design would allow only a 1/100 of an inch deflection.

Increasing the thickness of the tray unit 20 would in some respect increase the stiffness of the support. However this would be costly and time consuming and would require special configurations for special types of electronic modules and rack mounted cartridge tape modules.

As seen in FIG. 5, with the installation of a electronic module 16, the standard cabinet 10 would distort at the areas 12 and 14 considerably more than would be permissible for appearance and safety purposes.

The normal design for the internal tray units of the cabinet 10 of FIG. 5 basically utilized a tray unit 20 having a flat base plate 26 (FIGS. 1 and 2) to carry the load of the installed modules. The weight and center of gravity of these modules would vary depending on the module configuration and thus the support tray unit 20 and its base plate 26 could be loaded at one time with a particular module and at other times with a variety of different types of modules in the recessed area slots 11 of FIG. 5. Thus various different weight forces would be applied to a tray unit which would require different thickness trays leading t problems of supplying different thickness tray units for various modules loaded onto the tray units.

Calculations done by load analysis of the cabinet tray's original design have indicated that the tray unit thickness would have to increase considerably to provide the required stiffness to handle a range of different module loads. However such an increase in the tray thickness would not only be costly but involve considerable redesign from the standard trays which were being used. Further, developing a tray of varying thickness would involve unwanted time and expense, and potentially, a specially designed tray unit might be required for each combination of modules in the cabinet 10.

In order to take care of the problem where unsatisfactory distortions would occur at the areas 12 and 14 of FIG. 5, and other similar support areas in the cabinet 10, it was discovered that the idea of an adjustable deflection spring plate could be developed to engage the weight of the installed module on the tray unit. A concept of this spring plate was conceived as being fashioned by means of cutting it out of the tray unit and bending the finger plate at a specified angle $\Phi$ and/or alternatively developing a spring plate which could be applied with screws to the side walls 22, 24 of the tray unit 20.

By manipulating the geometry of the situation, selecting the material and the initial deflection of the spring plate, the weight of the inserted module would be supported by the spring plate 23, 25 into a coplanar condition with the base plane 26. As a result, the distortion appearance and deflection gaps could be controlled for various weights and centers of gravity of modules.

Thus the deflected spring plate and its variations was developed to provide an adjustable support that would control tray distortions for modules of any weight which were mounted on suspended flat plates while at the same time minimizing the final cabinet space requirements and the cabinet mass requirements with a supporting structure.

SUMMARY OF THE INVENTION

The present invention takes a supporting flat plane plate structure that provides material support to electronic modules (such as rack mounted tape drive modules) and then, via deflected spring plates, reduces distortion and bending of the supporting structure by engaging the product module above the surface of the flat base plate structure thus reducing the apparent load on the base plane of the supporting structure.

Thus the concept of a deflected spring plate structural member makes it possible for flat plate structures to deliver the load carry capabilities of plates of similar material with thicker cross sections while at the same time permitting a lesser thickness tray and more standardized tray to be used.

Additionally the design has adjustable features permitting minimization of distortions of modules with different weights and different weight distributions on a single flat plate supporting structure.

Before the concept of the deflected spring plate structure, the only way to increase the load carrying capability and stiffness of supporting structure was to modify the moment of inertia of the supporting structure by increasing its thickness. With the present arrangement this is no longer necessary.

DESCRIPTION OF PREFERRED EMBODIMENT

In order to provide greater load bearing capabilities without causing unwanted distortions to the tray units of installed modules 16 in the cabinet 10 of FIG. 5, there has been provided a set of deflected spring plates such as seen in FIGS. 1 and 2.

In FIGS. 1 and 2 the tray unit 20 is seen having a flat base plane area 26 and side walls 22 and 24.

The lip bracket areas 2, 4, and 6 are used for attaching and screwing down the tray unit onto the cabinet 10. An open cut out area 28$_b$ in the base plane 26 often serves as an air cooling opening.

Then as seen in FIGS. 1A and 2, a multiple sided cut out plate area is provided and set at a raised angle such that, for example, the left side finger plate 23 is raised at an angle Φ shown by deflection gap 27 and similarly the right hand finger plate 25 is raised at an angle shown by the deflection gap 29.

Figure 1B:
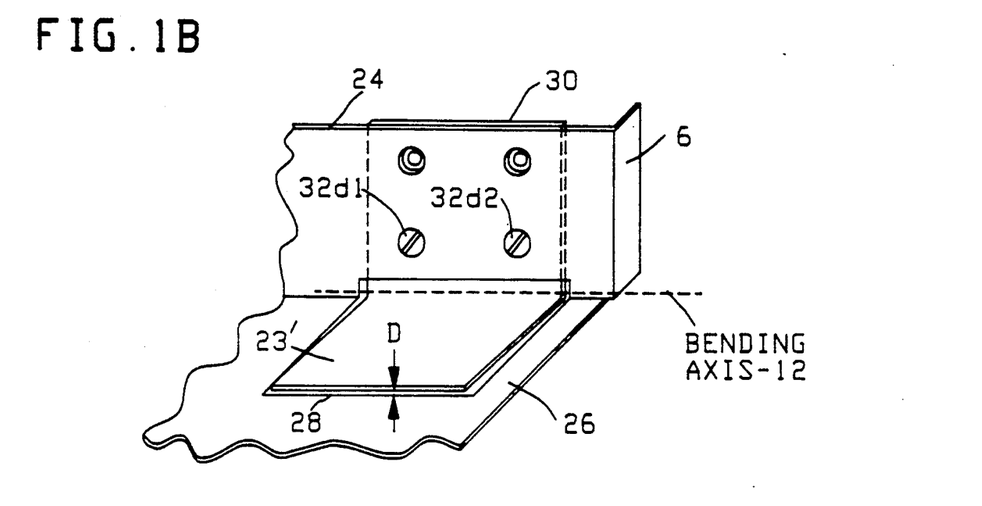
FIG. 1B is a schematic drawing showing how a separate angle member can be attached to the side wall of a tray unit.

The schematic drawing of FIG. 1B indicates an alternative arrangement where an area 28 cut out of the base plate 26 is occupied by a spring plate 23' of a detachable angled plate 30 connected by screws 32$d_1$ and 32$d_2$ to the side wall 24. The bending axis 12 indicates the line around which the lower spring plate 23 bends to form an angle with the plane at the base plate 26.

Figure 1C:
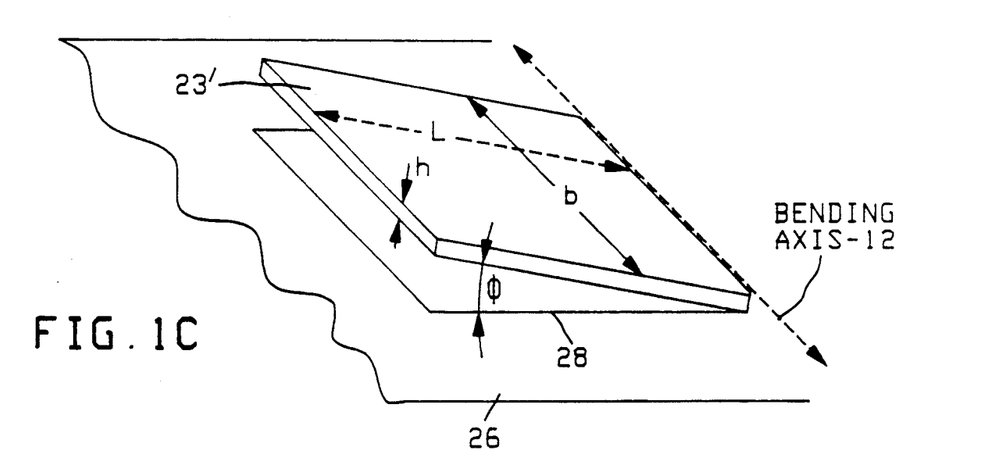
FIG. 1C is a schematic drawing illustrating the bending axis of a plate of length L and width "b" and thickness "h"

FIG. 1C is a schematic drawing showing a deflection spring plate 23' raised at an angle from the base plane 26 along the bending axis 12. The spring plate has a length "L", and breadth "b" and a thickness "h".

The tray unit 20 may be composed of various materials such as steel or aluminum or other rigid compositions. In FIG. 1A, the deflection spring plates 23 and 25 are made of the same material as the tray unit 26 since they are cut out extensions of the tray unit.

However, it is feasible, for example, to have the tray unit 26 made of steel while the angled member 30 with its spring plate 23 is aluminum or other material. Thus, flexibility is provided as to the use of different metal or different rigid compositions than that of the tray unit material.

Alternatively for example, the tray unit 20 might be made of aluminum while the deflection spring plate 23 might be made of steel.

Figure 1D:
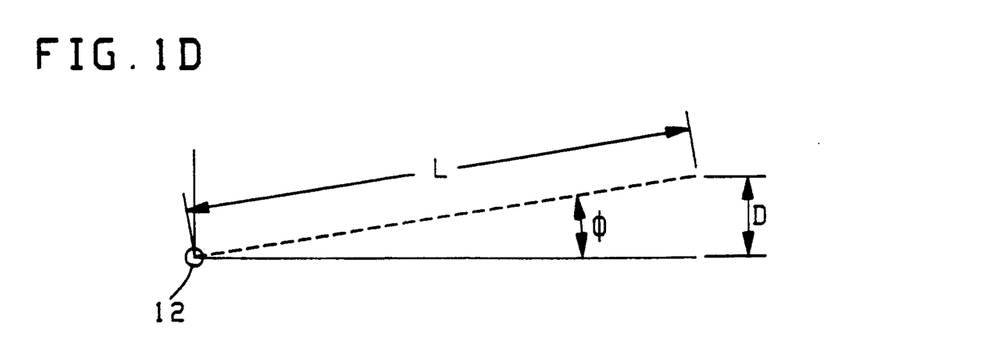
FIG. 1D is a diagram of relationship between the spring plate angle Φ and deflection D.

FIG. 1D is a drawing illustrating some of the parameters involved in the deflection spring plate arrangement from the bending axis 12. The spring plate extends for a length "L" at angle Φ to provide a deflection "D" from the base plane. Other parameters involve the composition of the material and its Young's Modulus "E", plus the thickness "h" and breadth "b" shown in FIG. 1C.

Referring to Tables I and II below, there are seen examples of two types of spring composition i.e. for steel in Table I and for aluminum, in Table II.

In Table I, for steel, when a Single Tape Unit Module of 22 lbs. is inserted onto a tray unit in a cabinet recess 11 (FIG. 5), the steel spring plate is set at an angle Φ of 0.31 degrees with a deflection D of 0.024 inches. This would involve steel of breadth (b) equal to 9 inches and thickness (h) of 0.105 inches plus a length (L) of 4.4 inches. The Young's Modulus for Steel is $E = 30 \times 10^6$.

In Table II, for aluminum, when a Tape Unit Controller and Auto Loader Module of 52 lbs. is loaded onto a tray unit, the aluminum spring plate is set at an angle Φ=2.22 degrees with a deflection of 0.1701 inches. This would involve an aluminum spring plate of length L=4.4 inches, a breadth (b) of 9 inches and thickness (h) of 0.105 inches. The Young's Modulus for aluminum is $E = 10 \times 10^6$.

Thus when a weighted module is inserted onto the left recess 15 of FIG. 1A, the spring plate 23 will support the module with minimal distortion to the base plane 26.

Likewise a weighted module inserted onto the right recess 16 of FIG. 1A will be supported by the spring plate 25.

The relationship between the deflection angle Φ and the type of material and the material parameters "b" and "h" for a weighted module exerting a downward force F in pounds (lbs) can be expressed:

$$SIN\Phi = \frac{D}{L} \text{ from FIG. 1D} \qquad \text{(EQ. I)}$$

$$D = \frac{FL^3}{3EI} \qquad \text{(EQ. II)}$$

where E = Young's Modulus for the Material Used.
where
I = Moment of Inertia of spring plate.
and L = Length of spring plate,
F = Weight of module.

TABLE I

| Module Description | Weight Lbf | Steel Plate Initial Deflection Inches | Corresponding Angle Degrees |
|---|---|---|---|
| Single Tape Unit | 22 | 0.0240 | 0.31 |
| Tape Unit and Power Supply | 35 | 0.0382 | 0.50 |
| Tape Unit and Controller | 42 | 0.0458 | 0.60 |
| Tape Unit Controller and Auto-Loader | 52 | 0.0567 | 0.74 |

TABLE II

| Module Description | Weight Lbf | Aluminum Plate Initial Deflection Inches | Corresponding Angle Degrees |
|---|---|---|---|
| Single Tape Unit | 22 | 0.0720 | 0.94 |
| Tape Unit and Power Supply | 35 | 0.1145 | 1.49 |
| Tape Unit and Controller | 42 | 0.1374 | 1.79 |
| Tape Unit Controller and Auto-Loader | 52 | 0.1701 | 2.22 |

Then from Equations I and II, the value of SINΦ can be calculated and the angle Φ determined from:

$$\Phi = ARC\ SINE\ D/L \tag{EQ. II}$$

As a result of the utilization of the spring plate arrangement, any undesired bending distortion in the base plane plate 26 will be obviated without need for replacing the tray units 26 with thicker or newly designed trays. These factors will also relieve stress and distortion on the lip-brackets 2,4 and 6 of FIG. 1A.

Figure 3:
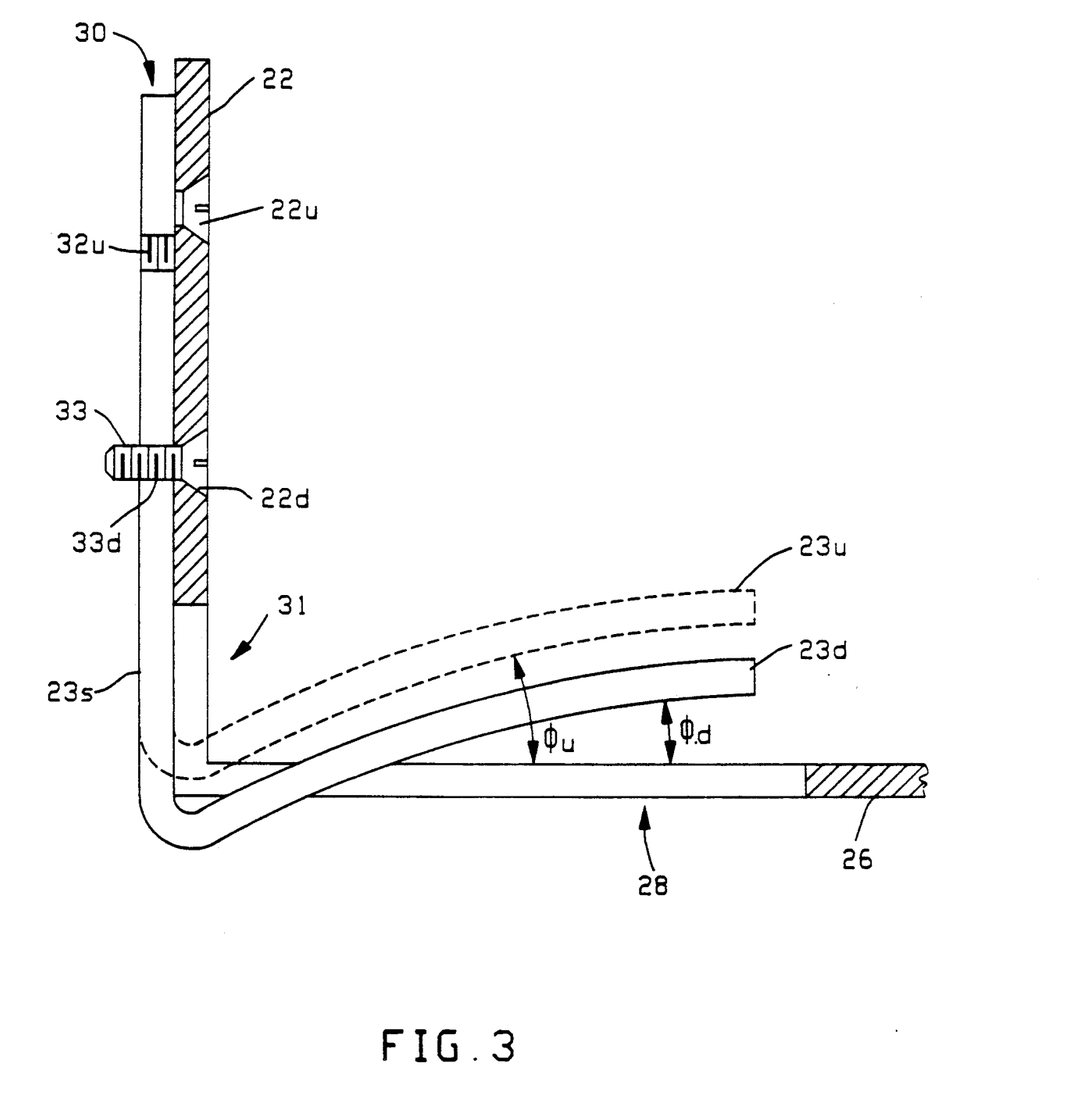
FIG. 3 is a drawing of an alternate mounting system designed for attaching a spring plate to the side walls or flanges of a tray unit to permit adjustable deflections.

The FIG. 3 shows an adjustable two position mounting arrangement for the use of the deflected spring plate embodiment. As seen in FIG. 3 the side wall 22 of the tray base 26 has screw cut-out locations for an upper mounting $22_u$ and for a lower mounting $22_d$. The support arm $23_S$ of the spring plate $23_u$ has two cut-outs, an upper cut-out $32_u$ and a lower cut-out $32_d$. These cutouts permit two positions providing different deflections for the spring plate 23 such that when the screw 33 is resident in the slot $32_u$ then the spring plate shown at $23_u$ will take the higher initial deflection as shown in FIG. 3.

On the other hand if the screw 33 resides, as shown in FIG. 3, at the cut-out $32_d$, then the spring plate assumes the lower deflecting position shown at $23_d$. A cutout gap area 31 in the side wall 22 permits up-down adjustment of the angled plate 30. The base plane cutout area 28 permits insertion of the spring plate to form angles such as $\Phi_u$ and $\Phi_d$.

Thus with the use of variable slots and cut-outs in the side wall 22 and in the angled arm 30, it is possible to make discrete and different adjustments for deflection of the finger plate 23 in order to accommodate different loading situations.

Figure 4:
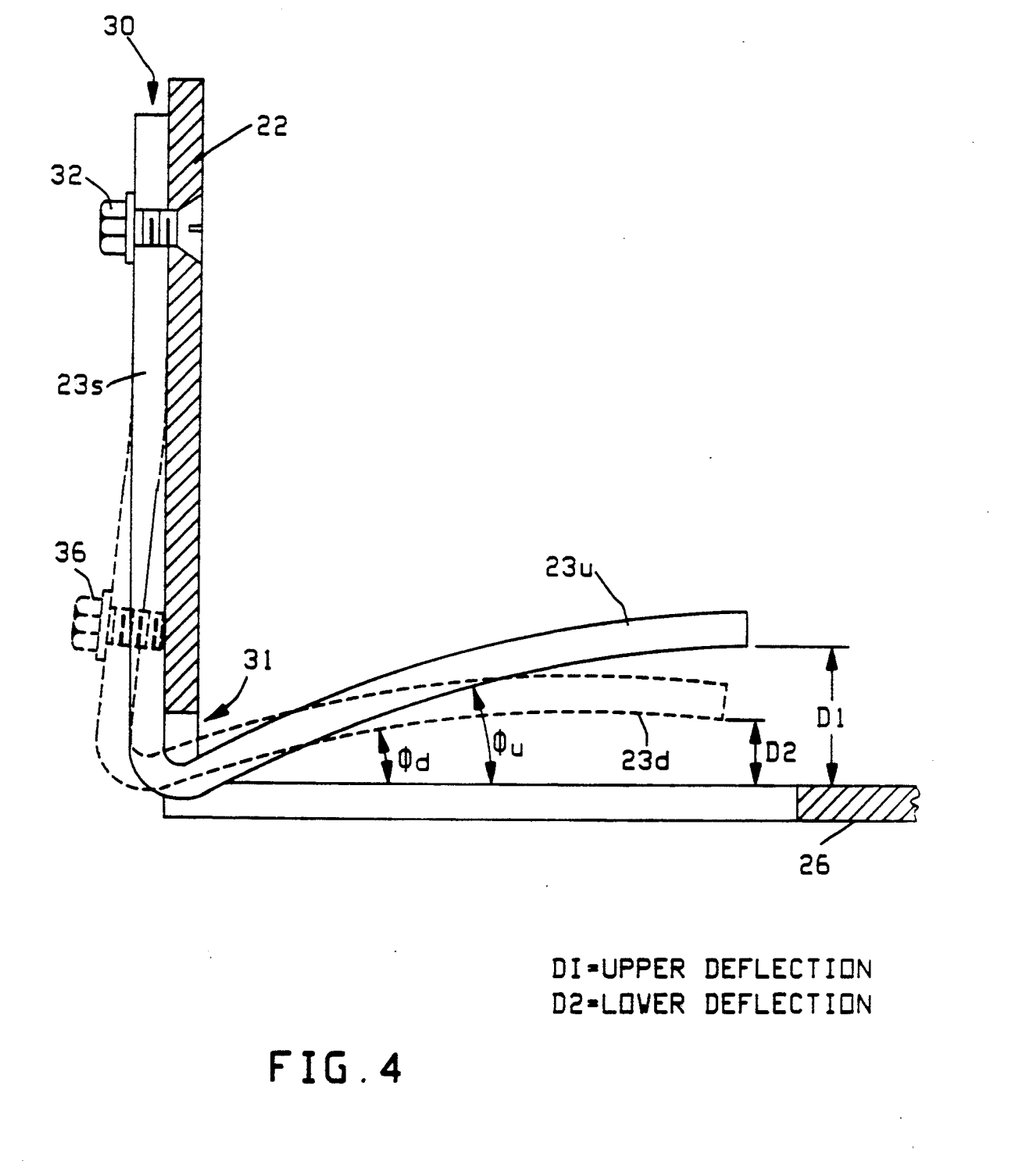
FIG. 4 is alternative design for attachment to the side walls of the base plate tray unit with adjustments for determining the amount of deflection of the spring plate angle.

FIG. 4 shows another adjustable deflection arrangement of the spring plate member wherein various gradients of different deflections are made possible on an adjustable basis.

In FIG. 4 the flat base plate 26 of the tray unit 20 at the juncture with the side wall 22 provides a cut-out 31 into which there is inserted the spring plate 23 which is part of the angled plate 30. The screw 32 provides a fixed attachment between the angled plate 30 and the side wall 22. On the support arm $23_S$ of the angled plate 30, there is seen an adjustment screw 36 which presses against the side wall 22 which permits various gradient levels of adjustment for deflection of the spring plate 23 so that there may be provided an upper level plate position $23_u$ or a lower level plate position $23_d$ and all the variations in between that are attributable to the setting of the adjustment screw 36.

Described herein has been a deflection adjustable spring plate member which is provided to a supporting flat plate structure in order to provide not only primary support but also the control of bending distortion due to any engaging module or product which resides above the flat plate structure, thus to reduce the apparent load on the supporting structure. Additionally certain variations of the spring plate member permit several sets of discrete deflections in one case or an infinite number of adjustable deflections in another embodiment so as to enable distortion free support of modules which reside on a flat planar base such as the described tray unit.

While the above disclosure has provided a preferred description of the features of this invention, it may be understood that other embodiments may encompass the concept presented which is defined in the following claims.

What is claimed is:

1. An apparatus for supporting weighted modules inserted therein comprising:
    (a) a flat planar support plate for supporting a weighted module and including:
        (a1) a first perpendicular wall at one end of said support plate;
        (a2) a first perpendicular wall at one end of said support plate;
        (a3) a central wall between said first and second walls forming first and second recessed spaces each capable of holding a weighted module;
        (a4) first and second cutout plates respectively residing in said first and second recessed spaces, each of said cut out plates including:
            (a41) a flat partially severed from said planar support plate and raised at an angle Φ to form a raised spring plate.

2. The apparatus of claim 1 wherein said angle Φ, between said raised spring plate and said planar support plate, is a function of the parameters involving the weight of the module being supported, the composition of the material of which said spring plate is made, the shape and moment of inertia of said raised spring plate.

3. The apparatus of claim 1 wherein said cut out flap is rectangular in shape and attached, at one edge, to said planar support plate to form a bending axis.

4. The apparatus of claim 3 wherein said angle is an angle whose sine is determined by D/L, where D is the deflection of said cut out raised spring plate at the length L of said raised edge of said spring plate from said bending axis.

5. In a support tray for holding a weighted module residing thereon, an apparatus for supporting modules of different weights without distortion of said support tray, said apparatus comprising:
    (a) a support tray having a flat planar base plane and two opposing side walls to form a recess for holding a weighted module, said flat planar base plane including:
        (a1) a partially cut out spring plate member bent around a bending axis to press against said weighted module;
        (a2) said bending axis constituting a straight line on said flat planar base plane.

6. The apparatus of claim 5 wherein said cut out spring plate is raised at an angle above said planar base plane, said angle being determined by the parameters including:
    (a) weight of said module
    (b) material composition and Young's Modulus of said planar base plane;
    (c) moment of inertia of said cut out spring plate.

7. The apparatus of claim 6 where the angle Φ is set according to the angle whose SINE = D/L where D is the deflection of said cut out spring plate at the length "L" from said bending axis,
and where $D = FL^3/3EI$
where
    F is the module weight;
    L is the spring plate length;
    E is the Young's Modulus Value for the material of the spring plate;
    I is the moment of inertia of the spring plate;
    where $I = bh^3/12$
    where b=breadth of spring plate;
h=thickness of spring plate.

8. The apparatus of claim 5 wherein said base plane and cut out spring plate are made of steel.

9. The apparatus of claim 5 wherein said base plane and cut out spring plate are made of aluminum.

10. In a support tray having a base plane and side walls on opposite sides for holding a weighted module thereon, an apparatus for limiting the amount of bending distortion in said base plane, comprising:
   (a) a partially cut out deflection plate member bent from said base plane to form a deflection angle from a bending axis line;
   (b) said deflection plate member set at said angle Φ to minimize the base plane distortion due to the weight of the supported module.

11. A method of limiting the bending distortion of the base plane of a support tray unit when loaded with a weighted module, said method comprising the steps of;
   (a) cutting a rectangular shape deflection plate out of a portion of said base plane and leaving one side attached as an axis of rotation;
   (b) setting said deflection plate at an angle Φ above said base plane of said tray unit.

12. The method of claim 11 which includes the step of:
   (c) calculating said angle according to parameters associated with module weight, material composition of said tray unit, shape and size of said deflection plate.

13. A method of limiting the bending distortion of the base plane of a support tray unit having sidewalls when loaded with a weighted module, said method comprising the steps of;
   (a) cutting out a rectangular portion of said base plane adjacent to a side wall;
   (b) fixedly attaching to said wall, an angled bracket having a deflection spring plate which fits through said cut out portion at an angle Φ to said base plane.

14. The method of claim 13 which includes the step of;
   (c) providing adjusting means to said angled bracket for allowing fine adjustment for said angle Φ.

15. In a support tray unit having a base plane for supporting a weighted module and having opposite side wall members, an apparatus for limiting bending distortion in said base plane, comprising:
   (a) a cut out area in said base plane adjacent said side wall member;
   (b) means for attaching an angled bracket to said sidewall, said angled bracket including:
   (b1) a deflection spring plate which resides in said cut out area to cause a spring pressure against said weighted module;
   (b2) means for adjustably setting said spring plate at a desired angle to said base plane.

* * * * *

UNITED STATES PATENT AND TRADEMARK OFFICE
CERTIFICATE OF CORRECTION

PATENT NO. : 5,219,145
DATED : June 15, 1993
INVENTOR(S) : Richard S. McAuley

It is certified that error appears in the above-identified patent and that said Letters Patent is hereby corrected as shown below:

At column 6, line 10,
    delete "first" and insert --second--.

At column 6, line 10,
    delete "one" and insert --the opposite--.

At column 6, line 18,
    delete "flat" and insert --flap--.

At column 6, line 49,
    after "angle" insert --$\Phi$--.

Signed and Sealed this

Thirtieth Day of May, 1995

Attest:

BRUCE LEHMAN

Attesting Officer      Commissioner of Patents and Trademarks